(12) United States Patent
Rae et al.

(10) Patent No.: US 10,332,930 B2
(45) Date of Patent: Jun. 25, 2019

(54) SINGLE PHOTON AVALANCHE DIODE (SPAD) ARRAY INCLUDING DISTRIBUTED OR TREE FOR READOUT

(71) Applicant: STMicroelectronics (Research & Development) Limited, Marlow (GB)

(72) Inventors: Bruce Rae, Edinburgh (GB); Ivan Ivanov, Schaumburg, IL (US)

(73) Assignee: STMicroelectronics (Research & Development) Limited, Marlow (GB)

( * ) Notice: Subject to any disclaimer, the term of this patent is extended or adjusted under 35 U.S.C. 154(b) by 106 days.

(21) Appl. No.: 14/977,259

(22) Filed: Dec. 21, 2015

(65) Prior Publication Data

US 2017/0176250 A1 Jun. 22, 2017

(51) Int. Cl.
*H01L 27/146* (2006.01)
*G01J 1/44* (2006.01)

(52) U.S. Cl.
CPC .. *H01L 27/14683* (2013.01); *H01L 27/14609* (2013.01); *H01L 27/14636* (2013.01); *H01L 27/14643* (2013.01); *G01J 2001/442* (2013.01); *G01J 2001/448* (2013.01); *G01J 2001/4466* (2013.01)

(58) Field of Classification Search
CPC ............ H01L 27/14609; H01L 31/107; H01L 27/14641; H01L 27/14643; G01S 7/497; G01S 7/4863; G01S 17/89
See application file for complete search history.

(56) References Cited

PUBLICATIONS

Braga et al., "A Fully Digital 8×16 SiPM Array for PET Application With Per-Pixel TDCs and Real-Time Energy Output," IEEE Journal of Solid Circuits, vol. 49(1), Jan. 2014, pp. 301-314 (14 pages).
S. Mandai et al., "Timing optimization of a H-tree based digital silicon photomultiplier," Published by Publishing for SISSA Medialab, Faculty of Electrical Engineering, TU Delft, Published Sep. 25, 2013, 10 pages.

*Primary Examiner* — Tony Ko
(74) *Attorney, Agent, or Firm* — Seed Intellectual Property Law Group LLP

(57) ABSTRACT

A device includes an array of single photon avalanche diodes (SPADs) and a plurality of pulse shapers. Each of the SPADs are electrically coupled to a respective SPAD quench circuit. Each of the pulse shapers have an input electrically coupled to an output of a respective SPAD quench circuit.

20 Claims, 7 Drawing Sheets

SINGLE PHOTON AVALANCHE DIODE (SPAD) ARRAY INCLUDING DISTRIBUTED OR TREE FOR READOUT

BACKGROUND

Technical Field

The present application is generally related to single photon avalanche diode (SPAD) sensors, and in particular, but not exclusively to, SPAD arrays for time-of-flight (TOF) image sensing.

Description of the Related Art

Single Photon Avalanche Diodes (SPADs) are semiconductor photon detection devices based on a p-n junction reverse-biased at a voltage that exceeds a breakdown voltage $V_B$ of the junction. At this bias, the electric field is so high that a single charge carrier injected into the depletion layer can trigger a self-sustaining avalanche. The current rises swiftly to a steady level. If the primary carrier is photo-generated, the leading edge of the avalanche pulse marks the arrival time of the detected photon. The current continues until the avalanche is quenched by lowering the bias voltage until the current ceases. In order to detect another photon, the bias voltage must be raised again above breakdown.

SPAD arrays can provide single-photon imaging, which is useful in a variety of applications. However, such arrays typically require readout and enable circuitry, and corresponding signal paths, which may be a limiting factor in the overall size or number of SPADs in such arrays.

BRIEF SUMMARY

In an embodiment, the present disclosure provides a device that includes an array of single photon avalanche diodes (SPADs), a plurality of quench circuits and a plurality of pulse shaping circuits. Each of the SPADs are electrically coupled to a respective one of the plurality of quench circuits, and each of the pulse shaping circuits have an input electrically coupled to an output of one of the plurality of quench circuits.

The device may include a plurality of OR logic elements, with each of the plurality of pulse shaping circuits having an output electrically coupled to an input of an OR logic element.

The OR logic elements may be positioned between columns of the array of SPADs. Pairs of adjacent SPADs may have respective pulse shaping circuit outputs coupled to ones of a first portion of the plurality of OR logic elements. Adjacent ones of the first portion of the plurality of OR logic elements may be coupled to ones of a second portion of the plurality of OR logic elements. All of the SPADs in the array may have a substantially same readout path length.

The device may further include a plurality of memory cells, with each of the memory cells being electrically coupled to one of the plurality of SPAD quench circuits.

In another embodiment, the present disclosure provides a single photon avalanche diode (SPAD) pixel that includes a SPAD, a quench circuit electrically coupled to the SPAD, and a pulse shaping circuit electrically coupled to the quench circuit.

The SPAD pixel may further include a memory cell electrically coupled to the quench circuit.

In another embodiment, the present disclosure provides a sensor that includes an array of SPAD pixels and a distributed OR tree. Each of the SPAD pixels include a respective output terminal configured to provide an output signal upon detection of a photon by the respective SPAD pixel. The distributed OR tree is coupled to the output terminals of all of the SPAD pixels in the array. A path length from the output terminal of each respective SPAD pixel to an output of the distributed OR tree is substantially the same.

The array of SPAD pixels may be arranged into rows and columns, and the distributed OR tree may include: a first OR logic element positioned between and coupled to first and second SPAD pixels of a first row; a second OR logic element positioned between and coupled to first and second SPAD pixels of a second row; and a third OR logic element positioned between the first and second rows, the third OR logic element coupled to the first OR logic element and the second OR logic element.

The SPAD pixels of the sensor may include a SPAD, a quench circuit electrically coupled to the SPAD, and an in-pixel pulse shaping circuit electrically coupled to the quench circuit.

The SPAD pixels may further include an in-pixel memory cell coupled to the quench circuit.

In yet another embodiment, the present disclosure provides a method that includes: forming an array of single photon avalanche diode (SPAD) pixels, each of the SPAD pixels having an output terminal; forming a distributed OR tree within the array of SPAD pixels, the distributed OR tree including a plurality of OR logic elements; and coupling output terminals of the SPAD pixels to input terminals of the distributed OR tree.

The method may include forming a pulse shaping circuit within each SPAD pixel of the array, and coupling output terminals of the pulse shaping circuits to input terminals of the distributed OR tree.

The method may further include positioning the plurality of OR logic elements within the array such that a path length from the output terminal of each respective SPAD pixel to an output of the distributed OR tree is substantially the same.

Forming a distributed OR tree within the array of SPAD pixels may include: forming a first OR logic element between first and second SPAD pixels of a first row; forming a second OR logic element between first and second SPAD pixels of a second row; and forming a third OR logic element between the first and second rows.

Coupling output terminals of the SPAD pixels to input terminals of the distributed OR tree may include: coupling a first input terminal of the first OR logic element to the output terminal of the first SPAD pixel of the first row; coupling a second input terminal of the first OR logic element to the output terminal of the second SPAD pixel of the first row; coupling a first input terminal of the second OR logic element to the output terminal of the first SPAD pixel of the second row; coupling a second input terminal of the second OR logic element to the output terminal of the second SPAD pixel of the second row; coupling a first input terminal of the third OR logic element to an output terminal of the first OR logic element; and coupling a second input terminal of the third OR logic element to an output terminal of the second OR logic element.

Forming an array of single photon avalanche diode (SPAD) pixels may include forming a memory cell in each SPAD pixel of the array.

BRIEF DESCRIPTION OF THE SEVERAL VIEWS OF THE DRAWINGS

Embodiments of the present application will now be described with reference to the following figures in which.

DETAILED DESCRIPTION

Sensors using Single Photon Avalanche Diode (SPAD) technology include one or more SPAD pixels arranged in an array. Such sensors may include image sensors for rangefinding and 3D imaging. SPAD-based Time-of-Flight (TOF) sensors, the time-of-flight of a photon from emission by a source, reflected by an object under measurement and then detected by the SPAD-based sensor is computed. The computed time-of-flight can then be processed to determine a distance or range, using direct and/or indirect techniques. Many other applications are possible utilizing SPAD arrays, employing the ability of SPADs to detect or count single incident photons. Accordingly, embodiments provided by the present disclosure can be utilized in a variety of applications, including for example: SPAD-based Time-of-Flight (TOF) sensors (e.g., proximity, distance measurement, auto-focus assistancy, 3D imaging, etc.); systems with auto-focus and/or zoom with varying aperture; infra-red applications; and gesture recognition (e.g., range and intensity inputs allow gesture recognition). Further, SPAD arrays in accordance with the present disclosure can have multiple different detection zones.

Figure 1:
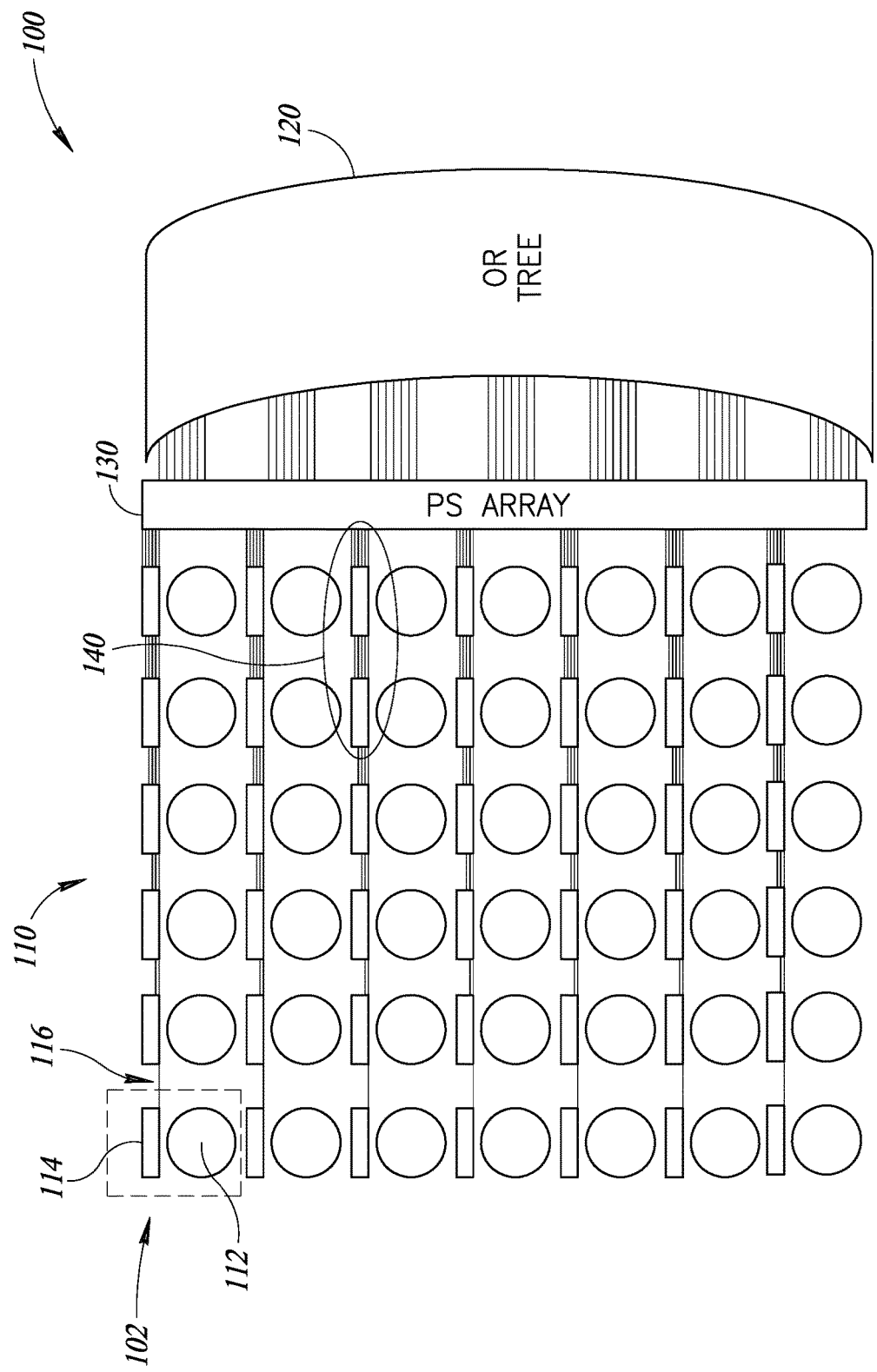
FIG. 1 is a block diagram illustrating a sensor device that includes a SPAD array and an OR tree.

FIG. 1 illustrates a sensor device 100 that includes a SPAD array 110 and an OR tree 120. The SPAD array 110 includes a number of SPAD pixels 102 (showing a single SPAD pixel inside the area shown in dashed lines), with each SPAD pixel 102 including a SPAD 112, a quenching circuit 114 and one or more output lines 116.

The quenching circuit 114 generally includes circuitry for: 1) sensing the leading edge of the avalanche current; 2) generating a standard output pulse synchronous with the avalanche build-up; 3) quenching the avalanche by lowering the bias down to the breakdown voltage; and 4) restoring the SPAD 112 to the operative level.

The output lines 116 are metal or other conductive material lines, which provide routing for output signals from each of the individual SPADs 112 to a pulse shaper array 130, and then to an input of the OR tree 120. In addition to the horizontal output lines 116, each SPAD pixel 102 includes an enable line (not shown) which connects each quench circuit 114 to logic circuitry outside the SPAD array 110.

Each SPAD 112 in the array 110 generates an output pulse stream, with pulses being generated and output by the SPADs 112 upon detection of a photon. The output signal is routed through output lines 116 to the pulse shaper array 130, which shapes the received pulses by reducing the pulse length. After being shaped by the pulse shaper array 130, the SPAD output signals are input to the OR tree 120. All of the SPADs 112 thus provide output signals, via output lines 116, which are logically OR'ed together by the OR tree 120. As such, all of the SPADs 112 in the SPAD array 110 act as a single sensor, with a single output indicating the detection of photons being provided from the OR tree 120.

As an example, detection of a photon by a SPAD 112 may cause the SPAD 112 to output a pulse having a 10 nanosecond (ns) pulse length. In such a case, the pulse shaper array 130 may shape the received 10 ns pulse by reducing the pulse length, for example, to 1 ns. Reducing the pulse length prevents the OR tree 120 from being "locked up" and unable to process additional pulses from other SPADs 112 for relatively long periods of time. For example, if the OR tree 120 receives a pulse from a SPAD 112 having a pulse length of 10 ns, without pulse shaping, the OR tree 120 would not be able to process the detection of another photon from a different SPAD 112 in the array 110 while the first 10 ns pulse is being processed. As such, near simultaneous photon detections from SPADs 112 in the SPAD array 110 may not be accurately detected. The pulse shaper array 130 thus increases accuracy of photon detection by the SPAD array 110 by reducing the pulse length of the SPAD 112 output signals before those signals are provided to an input of the OR tree 120.

As the number of pixels 102 in the SPAD array 110 increases, the number of enable and output lines 116 also increase, as each SPAD pixel 102 includes an enable line and an output line 116. Thus, routing congestion becomes an issue with increased SPAD pixels 102. Such routing congestion 140 is shown in FIG. 1, and the routing congestion 140 generally becomes worse in areas of the SPAD array 110 nearest to the pulse shaper array 130 and the OR tree 120, as output lines 116 from more distant SPAD pixels 102 are routed over or near the quench circuits 114 of SPAD pixels 102 nearer to the pulse shaper array 130 and the OR tree 120. Further, enable lines and output lines 116 cannot be routed over an active area (i.e., the SPADs 112 themselves) of the SPAD pixels 102. As such, routing congestion becomes a significant problem as the number of SPADs 112 in a SPAD array 110 increases, and routing congestion can be a limiting factor in the possible size of the SPAD array 110 shown in FIG. 1.

Similarly, a reduction in pitch (i.e., the distance between neighboring SPAD pixels 102) of the SPAD pixels 102 of the SPAD array 110 allows for an increase of the number of pixels per unit area, and thus results in an increase in the number of output lines 116 and enable lines per unit area, which produces routing congestion and ultimately limits pitch.

Thus, one drawback of the sensor device 100 shown in FIG. 1 is that the size and pitch of the SPAD array 110 is limited due to routing congestion 140. Further, the output lines 116 from SPAD pixels 102 that are located further away from the pulse shaper array 130 and OR tree 120 have a longer routing distance than do the output lines 116 from SPAD pixels 102 that are located nearer to the pulse shaper array 130 and OR tree 120. This introduces a mismatch, and thus delays in signal propagation, in the signal path lengths from the various SPAD pixels 102 to the OR tree 120. Such delays due to mismatched path length are typically minimized by adding unnecessary routing to output lines 116 (e.g., by "snaking" the lines) in order to make all SPAD pixels 102 have a same or close to same routing length; however, this makes all SPAD pixels 102 have a routing path length equal to the worst-case scenario (i.e., the longest path length). Additionally, output signal delays may be introduced due to the longer, snaking output lines 116, as the output lines 116 may have imperfections which introduce additional delay. Longer output lines 116 further result in a decrease in available area.

In a TOF system, the routing delays from individual SPADs 112 to the common array output (e.g., the pulse shaper array 130 and/or the OR tree 120) should be matched as close as possible. Any mismatch can lead to a range offset error.

Figure 2:
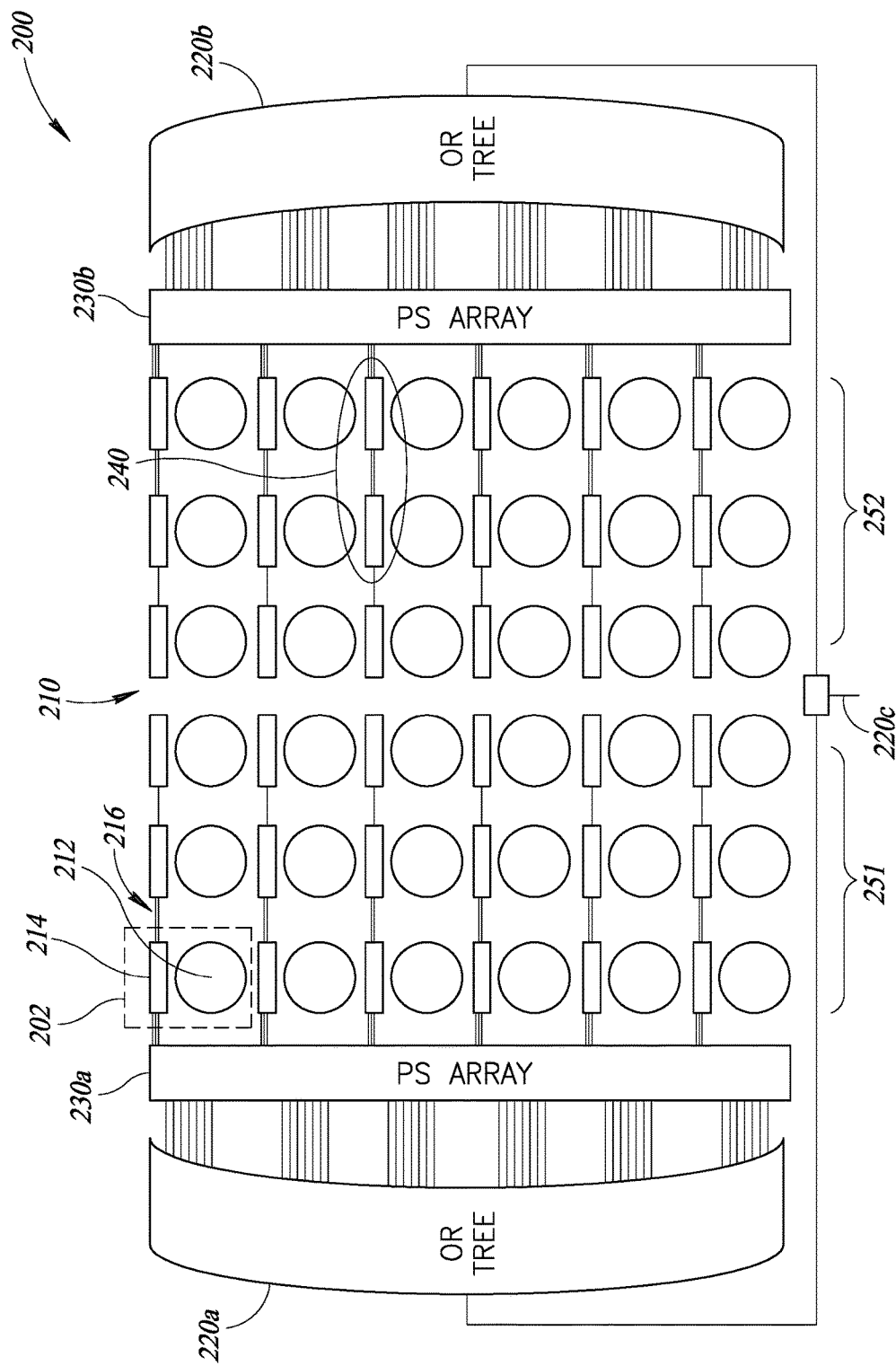
FIG. 2 is a block diagram illustrating a sensor device including a split OR tree readout arrangement, in accordance with embodiments of the present disclosure.

FIG. 2 is a block diagram illustrating a sensor device 200 including a split OR tree 220a-c readout arrangement, in accordance with one or more embodiments. The SPAD array 210 includes a number of SPAD pixels 202, with each SPAD pixel 202 including a SPAD 212, a quenching circuit 214 and one or more output lines 216. However, unlike the sensor device 100 of FIG. 1, the sensor device 200 of FIG. 2 includes a split OR tree 220a-c and a split pulse shaper array 230a, 230b.

The OR tree 220a-c includes a first OR logic element 220a which is positioned to receive, as inputs, the output signals from a first half 251 of the SPAD array 210. Similarly, a second OR logic element 220b receives, as inputs, the output signals from a second half 252 of the SPAD array 210. The outputs from the first OR logic element 220a and the second OR logic element 220b are provided as inputs to a third OR logic element 220c. As such, all of the outputs from the SPAD pixels 202 of the SPAD array 210 are logically OR'ed through the OR tree 220a-c, and thus the SPAD array 210 acts as a single sensor, with a single output indicating the detection of photons being provided from the third OR logic element 220c.

The sensor device 200 further includes a split pulse shaper array, with a first pulse shaper array 230a and a second pulse shaper array 230b. The first pulse shaper array 230a receives the output signals from the first half 251 of the SPAD array 210. Similarly, the second pulse shaper array 230b receives the output signals from the second half 252 of the SPAD array 210. Accordingly, pulses from each of the SPAD pixels 202 in the SPAD array 210 are reduced in pulse length by the pulse shaper array 230a, 230b prior to being input to the OR tree 220a-c.

By splitting the readout nets into first and second halves of an OR tree 220a, 220b, the number of parallel output lines 216 across a row of the SPAD array 210 is reduced by half. For example, the area of congestion 140 shown in FIG. 1 includes, at a point closest to the pulse shaper array 130, a total of six parallel output lines 116. This is because the output lines 116 from every SPAD pixel 102 in a single row of the SPAD array 110 are routed, in parallel, all the way across the SPAD array 110 to the pulse shaper array 130. In contrast, because the SPAD array 210 of the sensor device 200 of FIG. 2 is split into two halves 251, 252, the maximum parallel output lines 216 across any row of the SPAD array 210 is three. This is shown, for example, at the area 240. Thus, the amount of congestion due to readout of the output lines 216 is effectively cut in half with the sensor device 200 of FIG. 2, as compared to the sensor device 100 of FIG. 1.

Further, routing mismatch is reduced in the sensor device 200 as the longest output signal path for any SPAD pixel 202 in the SPAD array 210 is halved. By reducing the routing mismatch and congestion in the SPAD array 210, the SPAD array 210 thus may have an improved pitch, as well as an increase in the number of SPAD pixels 202 that can be included in such a sensor device 200.

Figure 3:
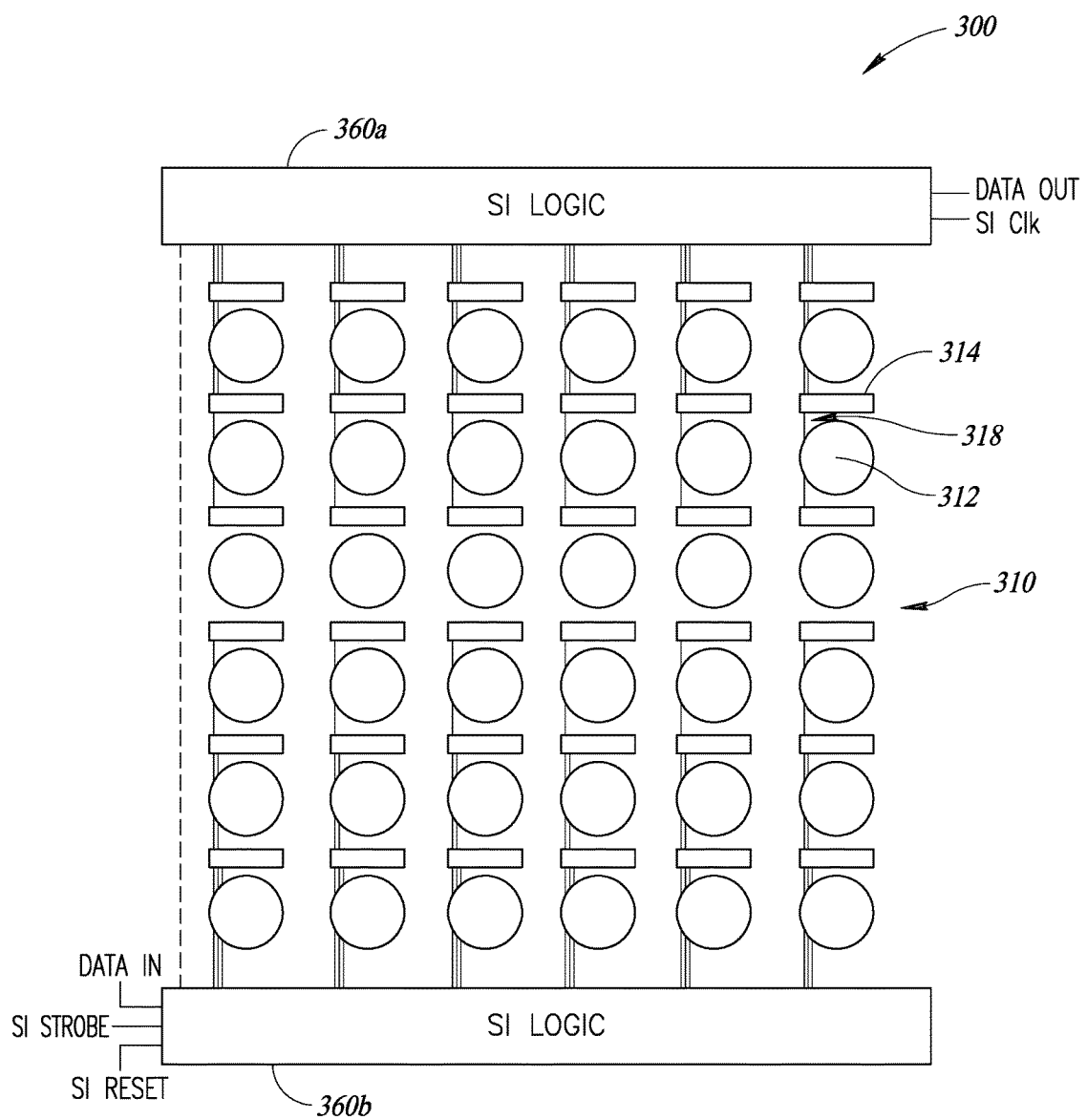
FIG. 3 is a block diagram illustrating a sensor device including a split enable control arrangement, in accordance with embodiments of the present disclosure.

FIG. 3 is a block diagram illustrating a sensor device 300 including a split enable control arrangement, in accordance with one or more embodiments. Enable control is provided from enable control circuitry 360a, 360b which is coupled to the quench circuits 314 of each SPAD 312 in the SPAD array 310. The quench circuits 314 are coupled to the enable control circuitry 360a, 360b through enable control lines 318. Enable control lines 318 may be arranged in perpendicularly to the output lines (e.g., 216 in FIG. 2) for readout. That is, as shown in FIG. 3, the enable control lines 318 may be arranged vertically, whereas the output lines 216 of FIG. 2 are arranged horizontally. Vertical congestion due to routing of enable control lines 318 can limit the pitch and the total number of SPADs 312 that can be included in a SPAD array 310, just as horizontal congestion due to routing of readout output lines 216 can be limiting. As shown in FIG. 3, such vertical congestion from enable control lines 318 can be improved by splitting the enable control circuitry into two halves: first enable control circuitry 360a, and second enable control circuitry 360b.

As such, the amount of congestion due to the enable control lines 318 is effectively cut in half with the sensor device 300 of FIG. 2, as compared to an array having a single enable control circuitry and enable control lines which are routed from all SPADs to the same enable control circuitry. Vertical congestion due to congested enable control lines 318, just like as with horizontal congestion due to congested readout output lines 216 (e.g., as shown in FIG. 2), can limit the SPAD array 310 pitch and total array size. Accordingly, by splitting the enable control circuitry into first and second enable control circuitry 360a, 360b, array size may be increased.

Figure 4:
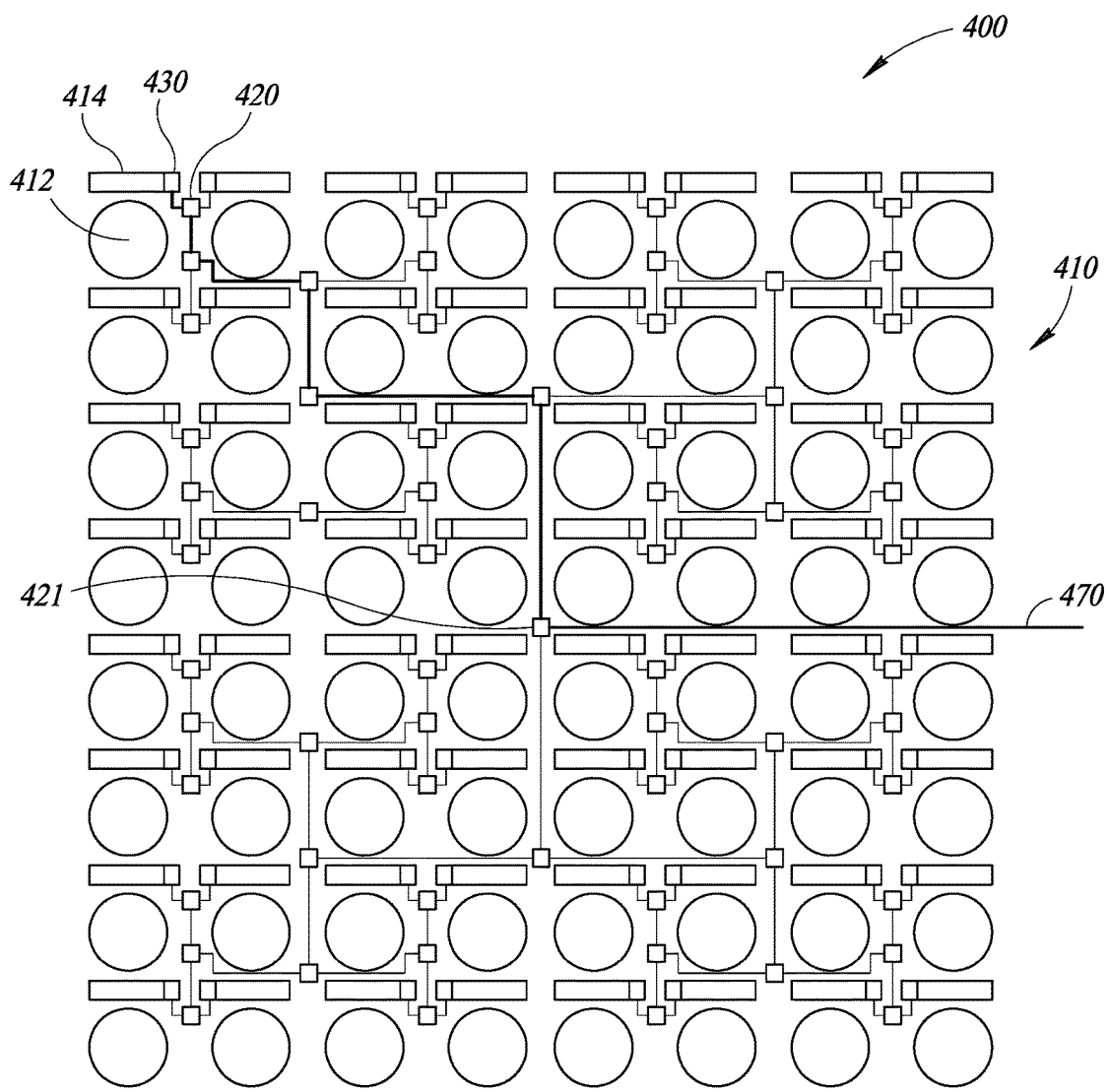
FIG. 4 is a block diagram illustrating a sensor device including a SPAD array having a distributed OR-tree arrangement, in accordance with embodiments of the present disclosure.

FIG. 4 is a block diagram illustrating a sensor device 400 including a SPAD array 410 having a distributed OR-tree arrangement, in accordance with one or more embodiments. The SPAD pixels within the SPAD array 410 include a SPAD 412 and a quench circuit 414. Further, a pulse shaper element 430 is included within each SPAD pixel, and may be arranged adjacent to and/or integrated with the quench circuit 414. The pulse shaper element 430 is used to reduce or minimize the pulse width of the SPAD 412 output for input into an OR tree. The OR tree of the sensor device 400 of FIG. 4 is a distributed OR tree having an H-tree design, with OR logic elements 420 distributed throughout the SPAD array 410. The pulse shaper elements 430 are thus included within each SPAD pixel (e.g., next to the quench circuit 414) so that the output pulse may be shaped prior to input to the distributed OR logic elements 420.

In the sensor device 400 shown in FIG. 4, all SPADs 412 have the same output signal path length (i.e., the path length from each SPAD 412 to a final OR logic element 421 in the distributed OR tree), regardless of how large the SPAD array 410 is. Thus, the SPAD array 410 is scalable without introducing any additional congestion. Further, the distributed OR tree of the SPAD array 410 reduces mismatching in routing, and further reduces delays which may be caused by snaking the routing lines, because the design is symmetric. That is, any imperfections due to output lines themselves are shared proportionally by all SPADs 412 in the SPAD array 410.

Because every SPAD 412 in the sensor device has an identical path length through the distributed OR tree to the final OR logic element 421 output, loading on each SPAD 412 is identical. Further, no external OR tree is required in the sensor device 400 of FIG. 1, as there is only a single output 470 from the SPAD array 410. This eases congestion of SPAD 412 output nets significantly. Additionally, each of the OR logic elements 420 of the distributed OR tree needs only two inputs (i.e., two inputs from adjacent SPADs 412, or two inputs from adjacent OR logic elements 420). This reduces variations between input paths through an OR element (as compared to a single OR element having many inputs, as shown in FIG. 1, for example), as no OR logic element 420 has more than two inputs. Further, propagation delay mismatch through the distributed OR tree is reduced, as propagation delay through an OR tree element may vary among input lines to that element. As such, fewer inputs to any OR logic element 420 results in fewer mismatches in the propagation delay.

Figure 5:
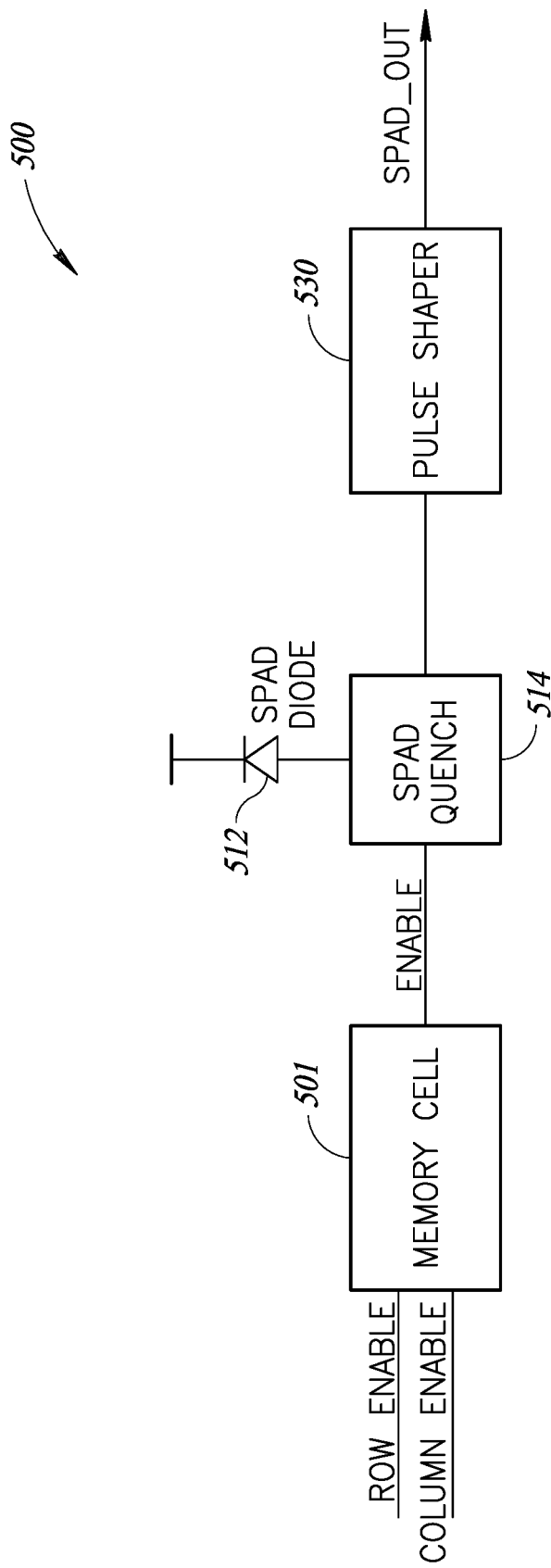
FIG. 5 is a block diagram illustrating a SPAD circuit, in accordance with embodiments of the present disclosure.

FIG. 5 is a block diagram illustrating a SPAD circuit 500, in accordance with one or more embodiments. The SPAD circuit 500 includes memory 501, a quench circuit 514 and a pulse shaper 530. The SPAD circuit 500 may be included in each SPAD pixel of a SPAD array. That is, the memory 501 may be an in-pixel memory, and the quench circuit 514 and pulse shaper 530 may similarly be provided in-pixel (shown in further detail in FIG. 6).

The SPAD circuit 500 allows individual enabling of the SPAD pixels, thereby reducing vertical line congestion. This results in improved routing complexity, and reduces load on the SPAD pixel output and ensures better pixel to pixel matching.

Figure 6:
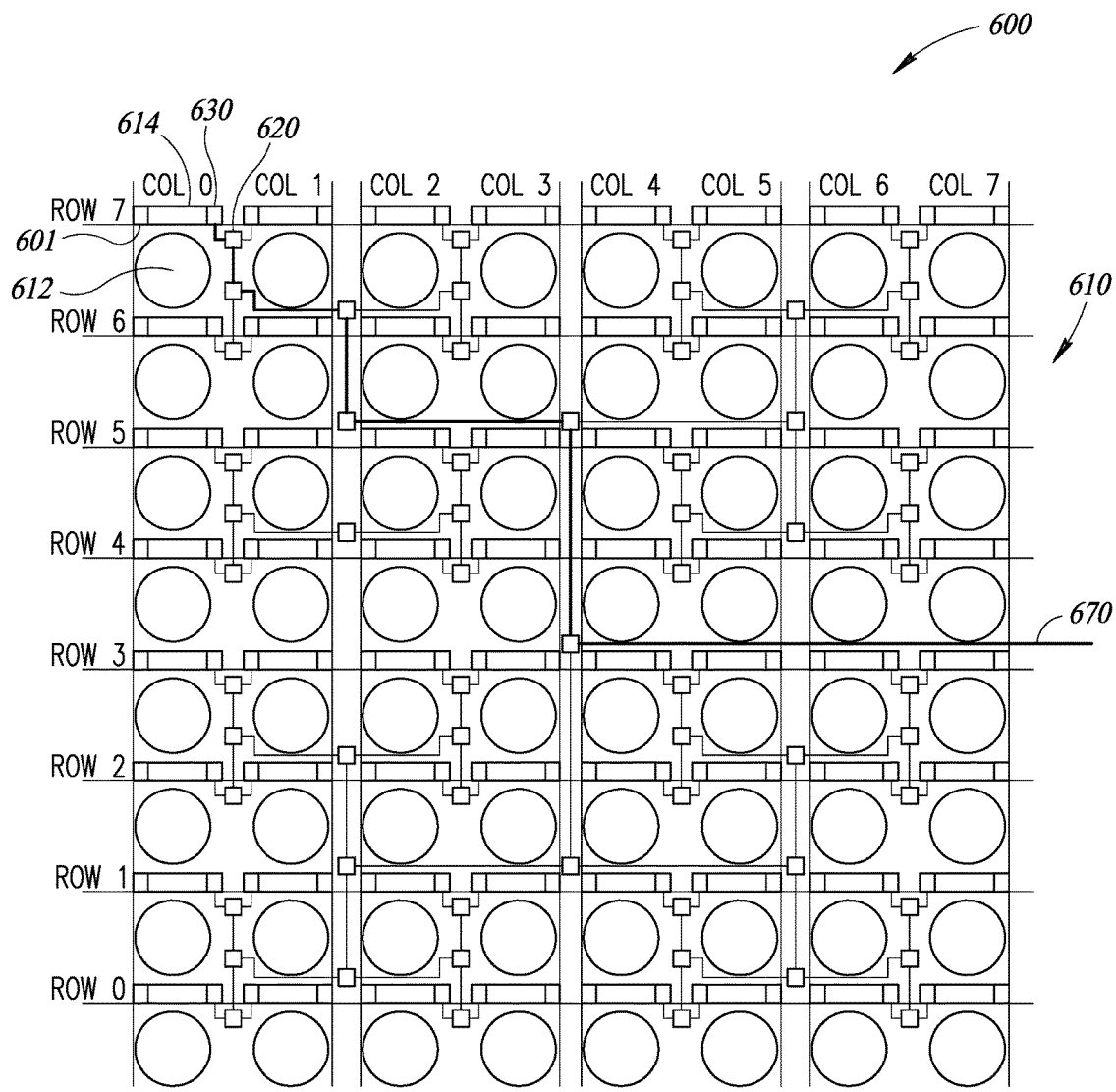
FIG. 6 is a block diagram illustrating a sensor device having distributed OR logic elements arranged in an H-tree, and further including in-pixel memory, in accordance with embodiments of the present disclosure.

FIG. 6 is a block diagram illustrating a sensor device 600 that is similar to the sensor device 400 shown in FIG. 4, with OR logic elements 620 being distributed in an H-tree arrangement, and further including in-pixel memory 601. By including a memory cell 601 in each SPAD 612 pixel, SPAD arrays can be scaled beyond the current, limited dimensions, and the possible array size is thus unlimited. Moreover, the path length of each SPAD 612 output line is matched, thereby reducing SPAD-to-SPAD ranging mismatch. The pulse shaper element 630 may be placed local to each SPAD (i.e., in pixel), or may be arranged adjacent to the first stage of the OR-tree. With the sensor device 600 shown in FIG. 6, any SPAD 612 within the SPAD array 610 can be enabled (i.e., by row, column, or individually). The in-pixel memory 601 allows information to be stored indicating whether an associated SPAD 612 is enabled or not. Enabled SPADs 612 can contribute to the OR-tree output 670.

Figure 7:
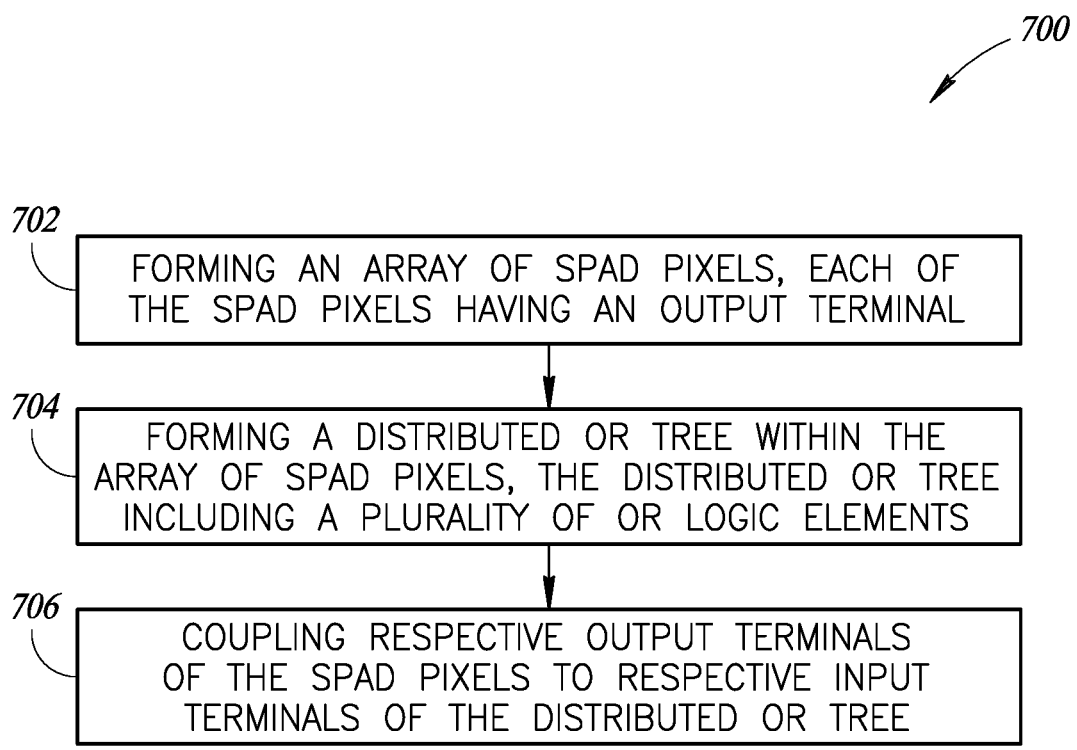
FIG. 7 is a flow-chart illustrating a method for forming a sensor device, in accordance with embodiments of the present disclosure.

FIG. 7 is a flow-chart illustrating a method 700 for forming a sensor device, in accordance with one or more embodiments. At block 702, the method includes forming an array of single photon avalanche diode (SPAD) pixels 610. Each of the SPAD pixels includes an output terminal. Forming the array 610 of single photon avalanche diode (SPAD) pixels may include forming a pulse shaper 630 within each SPAD pixel of the array 610. Forming the array 610 of SPAD pixels may further include forming a memory cell in each SPAD pixel of the array.

At block 704, the method includes forming a distributed OR tree within the array 610 of SPAD pixels, and the distributed OR tree includes a plurality of OR logic elements 620. Forming a distributed OR tree may include positioning the plurality of OR logic elements 620 within the array 610 such that a path length from the output terminals of each SPAD pixel to an output 670 of the distributed OR tree is equal.

At block 706, the method includes coupling respective output terminals of the SPAD pixels to respective input terminals of the distributed OR tree. Coupling respective output terminals of the SPAD pixels to respective input terminals of the distributed OR tree may include coupling an output terminal of respective pulse shapers 630 to respective input terminals of the distributed OR tree.

In one or more embodiments, the present disclosure provides a device, comprising: a plurality of single photon avalanche diode (SPAD) pixels; a first OR logic element; a second OR logic element; and a third OR logic element, wherein outputs of a first portion of the plurality of SPAD pixels are coupled to the first OR logic element, outputs of a second portion of the plurality of SPAD pixels are coupled to the second OR logic element, and outputs of the first and second OR logic elements are coupled to the third OR logic element.

In further embodiments, the present disclosure provides a device comprising: a plurality of single photon avalanche diode (SPAD) pixels; a first enable control circuit; and a second enable control circuit, wherein a first portion of the plurality of SPAD pixels are electrically coupled to the first enable control circuit, and a second portion of the plurality of SPAD pixels are electrically coupled to the second enable control circuit.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
    an array of single photon avalanche diode (SPAD) pixels, each of the SPAD pixels including:
        a single SPAD;
        a quench circuit adjacent to the single SPAD and electrically coupled to the SPAD; and
        a pulse shaping circuit adjacent to the single SPAD and having an input electrically coupled to an output of the quench circuit,
    wherein the SPAD, quench circuit, and pulse shaping circuit of a respective SPAD pixel are physically separate from the SPADs, quench circuits, and pulse shaping circuits of all other SPAD pixels of the array of SPAD pixels.

2. The device of claim 1, further comprising a plurality of OR logic elements, each of the pulse shaping circuits having an output electrically coupled to an input of an OR logic element.

3. The device of claim 2, the plurality of OR logic elements being positioned between adjacent columns of SPAD pixels of the array of SPAD pixels.

4. The device of claim 3, wherein all SPAD pixels in the array have a substantially same readout path length.

5. The device of claim 2, wherein pairs of adjacent SPAD pixels have respective pulse shaping circuit outputs coupled to ones of a first portion of the plurality of OR logic elements.

6. The device of claim 5, wherein outputs of adjacent ones of the first portion of the plurality of OR logic elements are coupled to ones of a second portion of the plurality of OR logic elements.

7. The device of claim 1 wherein each of the SPAD pixels further includes a memory cell adjacent to the single SPAD and electrically coupled to the quench circuit.

8. The array of SPAD pixels of claim 7, each of the SPAD pixels further comprising:
    a memory cell in the SPAD pixel and electrically coupled to the quench circuit.

9. The device of claim 1 wherein the pulse shaping circuit, in operation, reduces an output pulse width of the single SPAD.

10. An array of single photon avalanche diode (SPAD) pixels, each of the SPAD pixels comprising:
a single SPAD;
a quench circuit adjacent the single SPAD in the SPAD pixel and electrically coupled to the single SPAD; and
a pulse shaping circuit adjacent to the single SPAD in the SPAD pixel and electrically coupled to the quench circuit,
wherein the quench circuit and the pulse shaping circuit of the single SPAD are positioned between the single SPAD and an adjacent SPAD pixel of the array of SPAD pixels, and the pulse shaping circuit, in operation, reduces an output pulse width of the single SPAD.

11. A sensor, comprising:
an array of single photon avalanche diode (SPAD) pixels, each of the SPAD pixels including a single SPAD and an in-pixel pulse shaping circuit adjacent to and electrically coupled to the single SPAD, each of the SPAD pixels further including a respective output terminal configured to provide an output signal upon detection of a photon by the respective SPAD pixel;
a distributed OR tree coupled to the output terminals of all of the SPAD pixels in the array, wherein a path length from the output terminal of each respective SPAD pixel to an output of the distributed OR tree is substantially the same,
wherein the SPAD and pulse shaping circuit of a respective SPAD pixel are physically separate from the SPADs and pulse shaping circuits of all other SPAD pixels of the array of SPAD pixels.

12. The sensor of claim 11, wherein the array of SPAD pixels is arranged into rows and columns and the distributed OR tree includes:
a first OR logic element positioned between and coupled to first and second SPAD pixels of a first row;
a second OR logic element positioned between and coupled to first and second SPAD pixels of a second row; and
a third OR logic element positioned between the first and second rows, the third OR logic element coupled to the first OR logic element and the second OR logic element.

13. The sensor of claim 11, each of the SPAD pixels comprising:
a quench circuit adjacent to and electrically coupled to the single SPAD, wherein the in-pixel pulse shaping circuit is electrically coupled to the quench circuit.

14. The sensor of claim 13, each of the SPAD pixels further comprising:
an in-pixel memory cell electrically coupled to the quench circuit.

15. A method, comprising:
forming an array of single photon avalanche diode (SPAD) pixels, each of the SPAD pixels having a single SPAD and a pulse shaping circuit adjacent to and electrically coupled to the single SPAD, the pulse shaping circuit having an output terminal, the SPAD and pulse shaping circuit of each SPAD pixel being physically separate from the SPADs and pulse shaping circuits of all other SPAD pixels of the array of SPAD pixels;
forming a distributed OR tree within the array of SPAD pixels, the distributed OR tree including a plurality of OR logic elements; and
coupling output terminals of the SPAD pixels to input terminals of the distributed OR tree.

16. The method of claim 15, wherein forming an array of single photon avalanche diode (SPAD) pixels includes forming a pulse shaping circuit within each SPAD pixel of the array, and wherein coupling output terminals of the SPAD pixels to input terminals of the distributed OR tree includes coupling output terminals of the pulse shaping circuits to input terminals of the distributed OR tree.

17. The method of claim 15, wherein forming a distributed OR tree comprises positioning the plurality of OR logic elements within the array such that a path length from the output terminal of each respective SPAD pixel to an output of the distributed OR tree is substantially the same.

18. The method of claim 15, wherein forming a distributed OR tree within the array of SPAD pixels comprises:
forming a first OR logic element between first and second SPAD pixels of a first row;
forming a second OR logic element between first and second SPAD pixels of a second row; and
forming a third OR logic element between the first and second rows.

19. The method of claim 18, wherein coupling output terminals of the SPAD pixels to input terminals of the distributed OR tree comprises:
coupling a first input terminal of the first OR logic element to the output terminal of the first SPAD pixel of the first row;
coupling a second input terminal of the first OR logic element to the output terminal of the second SPAD pixel of the first row;
coupling a first input terminal of the second OR logic element to the output terminal of the first SPAD pixel of the second row;
coupling a second input terminal of the second OR logic element to the output terminal of the second SPAD pixel of the second row;
coupling a first input terminal of the third OR logic element to an output terminal of the first OR logic element; and
coupling a second input terminal of the third OR logic element to an output terminal of the second OR logic element.

20. The method of claim 15, wherein forming an array of single photon avalanche diode (SPAD) pixels comprises:
forming a memory cell in each SPAD pixel of the array.

* * * * *